United States Patent [19]

Piasecki

[11] Patent Number: 4,631,422
[45] Date of Patent: Dec. 23, 1986

[54] TTL CIRCUIT WITH A CLAMPING TRANSISTOR FOR SPEEDY TURN-OFF OF OUTPUT TRANSISTOR

[75] Inventor: Douglas S. Piasecki, Middletown Township, Monmouth County, N.J.

[73] Assignee: RCA Corporation, Princeton, N.J.

[21] Appl. No.: 562,529

[22] Filed: Dec. 19, 1983

[51] Int. Cl.$^4$ .................. H03K 19/013; H03K 19/088
[52] U.S. Cl. .................... 307/300; 307/456; 307/280; 307/549
[58] Field of Search ............ 307/270, 456, 300, 542, 307/549, 551, 557, 552, 280

[56] References Cited

U.S. PATENT DOCUMENTS

| | | | |
|---|---|---|---|
| 3,641,368 | 2/1972 | Gamble et al. | 307/300 |
| 3,958,136 | 5/1976 | Schroeder | 307/300 |
| 4,330,723 | 5/1982 | Griffith | 307/456 |
| 4,449,063 | 5/1984 | Ohmichi et al. | 307/456 |
| 4,506,176 | 3/1985 | Harris | 307/557 |

Primary Examiner—Stanley D. Miller
Assistant Examiner—Richard Roseen
Attorney, Agent, or Firm—Joseph S. Tripoli; Henry I. Schanzer

[57] ABSTRACT

A first output transistor, operated in the common emitter mode, has its conduction path connected between an output terminal and a first point of operating potential. A phase splitting transistor whose base is coupled to a signal input terminal supplies a turn-on current to the base of the first transistor for one value of input signal and interrupts the flow for another value of input signal. The discharge of residual charge on the base of the first transistor and its speedy turn-off is accomplished by means of a clamping transistor whose collector-to-emitter path is connected between the base and emitter of the first transistor and which is turned on concurrently with the turn-off of the phase splitting transistor.

8 Claims, 6 Drawing Figures

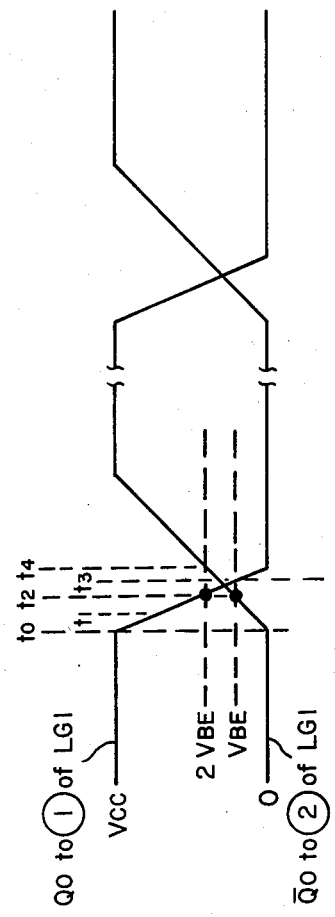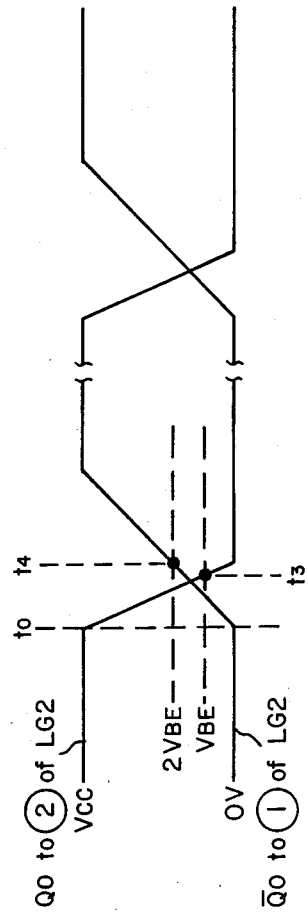

TTL CIRCUIT WITH A CLAMPING TRANSISTOR FOR SPEEDY TURN-OFF OF OUTPUT TRANSISTOR

The Government has rights in this invention pursuant to Subcontract No. A1ZV-684213-E-507 under Contract No. F04704-78-C-0021 awarded by the Department of the Air Force.

This invention relates to switching circuits and in particular to means for increasing the speed of response of certain switching circuits.

Problems relating to a known switching circuit are best explained with reference to the Prior Art circuit of FIG. 1.

In order to achieve fast rise and fall times while driving capacitive loads (which may be in the order of hundreds of picofarads) it is necessary for the output stage of a circuit to have active pull-up and pull-down circuitry. Thus, the output stage includes a first transistor, T1, operated in the common emitter mode to clamp the output to a first point of potential (e.g. ground), and a second transistor, T2, operated as an emitter follower to pull the circuit output to a second point of operating potential (e.g. $V_{CC}$). To ensure good clamping action there should be little resistance in series with the conduction paths of the first and second transistors which would limit the current. However, under many operating conditions the two transistors may conduct at the same time. This may occur when one of the two transistors is being turned on and the other is being turned off, or when the input signal has a value causing both transistors to be on. When the two transistors are on at the same time, large currents referred to as "spike-through" or "transient currents" flow between the first and the second points of potential through the series connected conduction paths of the two transistors. These currents are limited, substantially, only by the current gains of the transistors and the total path resistance. If these currents are too high or flow for too long a period of time, the power dissipation ratings of the transistors may be exceeded and the transistors destroyed. Also, excessive power demands are placed on the power supply connected to the points of potential.

An analysis of the circuit of FIG. 1 indicates that transistors T1 and T2 are most likely to be on at the same time when the input signal, V1N, makes a transition from the high level to the low level. The high-to-low transition of VIN tends to turn-on the input transistor T4 and turn-off phase splitting transistor T3, which had been conducting. When T3 turns-off T2A and T2 turn-on supplying a current into output terminal 01 having a polarity to charge the output capacitance $C_0$ to $V_{CC}$. However, although T3 is turned-off there is residual charge on the base of T1, which had been turned-on hard, maintaining T1 turned-on. The residual charge on the base of T1 is due, in part, to charge storage by capacitance between the base and the collector ($C_{BC}$) and between the base and emitter ($C_{BE}$) of T1. The charge stored on the base of T1 may be discharged to ground via resistor R1. However, the value of R1 cannot be made small without slowing down the turn-on of T1. Hence with typical values of R1 (e.g. in the range of 5000 ohms) it takes a relatively long time, in high speed applications, to discharge the base of T1 and T1 remains conducting after T3 is turned-off. The continued turn-on of T1 increases the power dissipation of the circuit since it provides a path to ground while T2 and T2A are being turned-on. Furthermore, the continued turn-on of T1 slows the rise time at the output since it prevents $C_0$ from being charged up towards $V_{CC}$. Where $C_0$ is relatively large, the problems of power dissipation and speed of response are further aggravated.

These problems are reduced in circuits embodying the invention by using an active control network to turn-off T1 when T3 is being turned-off and T2 is being turned-on.

Circuits embodying the invention include a first transistor having its main conduction path connected between an output point and a first point of operating potential, a second transistor having its main conduction path connected between the output point and a second point of operating potential, a third, phase splitting, transistor having its main conduction path connected between the control electrodes (base or gates) of the first and second transistors for controlling their turn-on and turn-off in response to an input signal, and means for speeding the turn-off of the first transistor when the third transistor is being turned-off. The latter means includes a fourth transistor having its main conduction path connected between the control electrode of the first transistor and the first point of potential and means for supplying a control signal to the control electrode of the fourth transistor having a polarity and magnitude to turn-it-on and causing it to turn-off the first transistor, when the phase splitting transistor is being turned-off.

In the accompanying drawing like reference characters denote like components; and FIG. 1 is a schematic diagram of a Prior Art logic gate;

FIGS. 5A and 5B are waveforms of signals produced at the outputs of flip-flop 20.

NPN bipolar transistors are used to illustrate the invention. However, PNP bipolar transistors or other known transistors, such as insulated-gate field-effect transistors (IGFETs), may be used to practice the invention so long as these transistors have first (e.g. emitter or source) and second (e.g. collector or drain) electrodes defining the ends of a main conduction path and a control electrode (base or gate) whose applied potential relative to the first electrode controls the conductivity of, or the current flow within, the main conduction path.

Figure 1:
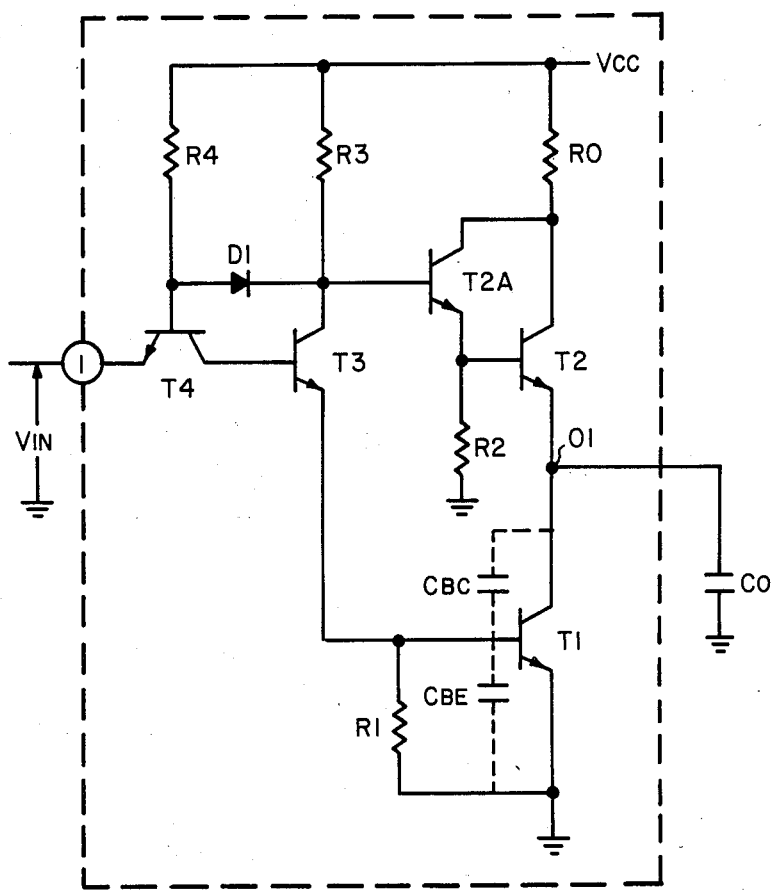
Figure 2:
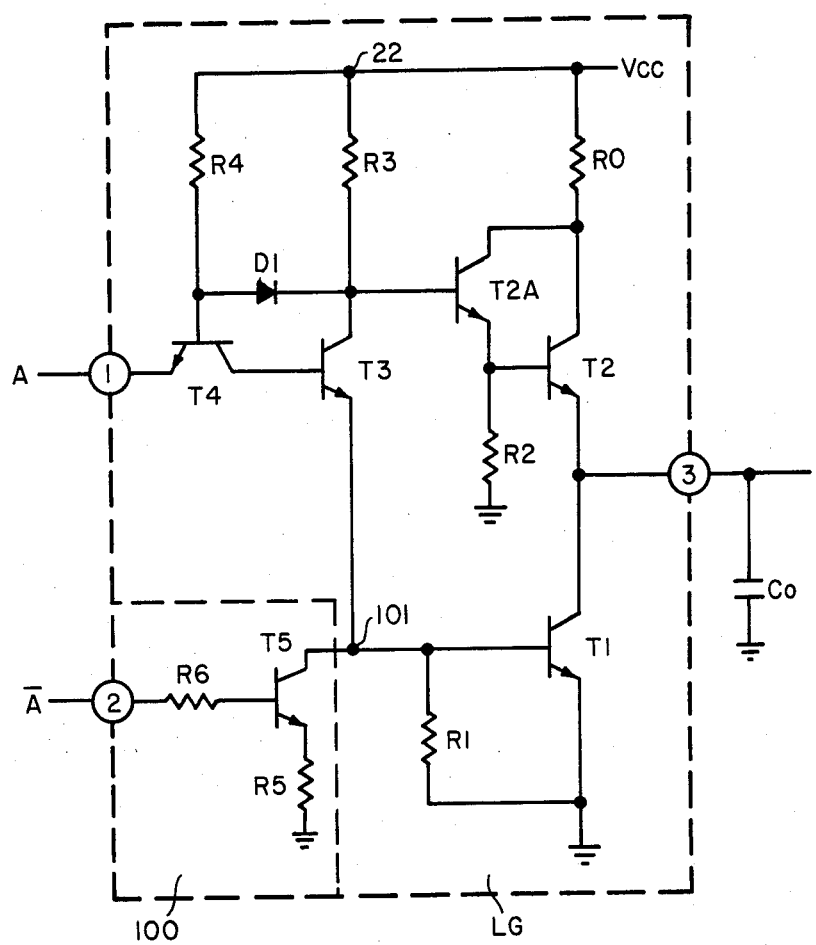
FIG. 2 is a schematic diagram of a logic gate embodying the invention.

The circuit of FIG. 2 is a logic gate (LG) which differs from the circuit of FIG. 1 by the addition of a speed up network 100. The speed up network 100 includes a transistor T5 driven by a control signal (e.g. $\overline{A}$ applied to a control terminal 2, which is the complement of the signal (e.g. A) applied to a signal input terminal 1. The circuit of FIG. 2 includes a first, pull-down, transistor T1 whose collector is connected to an output terminal 3 and whose emitter is grounded. A ground return resistor R1 is connected between the base and emitter of T1. A pull up transistor T2 is connected at its emitter to terminal 3 and at its collector, via a small current limiting resistor, R0, to terminal 22 to which is applied an operating potential of $V_{CC}$ volts. A transistor T2A is connected in Darlington fashion with T2—i.e., its collector is connected to the collector of T2 and its emitter is connected to the base of T2. A ground return resistor R2 is connected between ground and the base of T2. The base of T2A is connected to the collector of a phase splitting transistor T3 and via resistor R3 to node 22.

T3 is driven by means of an input transistor T4 whose emitter is connected to signal input terminal 1, whose base is returned via resistor R4 to node 22, and whose collector is connected to the base of T3. A diode D1, connected between the base of T4 and the collector of T3, tends to prevent the potential at the latter from going more than one forward diode drop below the base of T4. T3 is connected at its emitter to node 101 to which are connected the base of T1, one end of R1, and the collector of T5. The emitter of T5 is connected via a resistor R5 to ground. R5 is typically a small resistor ranging in value between 10 and 1000 ohms. The value of R5 is designed to limit the current in T5 and also to limit the loading on the signal applied to control terminal 2. Its value can be increased or decreased without departing from the teachings of the invention. The base of T5 is connected via a current limiting resistor R6 to a control terminal 2 to which is applied a signal $\overline{A}$ which is the complement of the signal A applied to terminal 1. The purpose of discussion, it is assumed that A and $\overline{A}$ occur synchronously and that they have coincident rising and falling edges.

In describing the operation of the circuit, it is assumed that the forward base-to-emitter voltage drop ($V_{BE}$) of the bipolar transistors and the forward drop ($V_F$) of a conventional diode (PN junction) are equal to 0.7 volt at room temperature. The collector-to-emitter voltage ($V_{CE\ SAT}$) of a transistor driven into saturation is assumed to be 0.3 volt. Also, for purposes of the present discussion, it is assumed, arbitrarily, that a relatively high voltage level (e.g. at, or close to, $V_{CC}$ volts) also referred to as "HIGH", represents the binary "1" state and a relatively LOW level (e.g. at, or close to, ground) also referred to as "LOW" represents the binary "0" state. For the sake of brevity in the explanation which follows, it is sometimes stated that a circuit point is low ("0") or high ("1") rather than stating that a signal representing a low or a high is applied to, or produced by or at, the circuit point.

When the input signal A makes a low to high transition, the emitter-to-base junction of T4 is reverse biased. As soon as the signal A exceed $2V_{BE}$ volts ($\approx 1.4$ volts), current flows from node 22 via R4 into the base of T3. This current amplified by the forward current gain ($\beta$) of T3 then flows into Node 101. The resulting base current into T1 is further amplified by the $\beta$ of T1 which then clamps output terminal 3 to ground via its collector-to-emitter path. Note that when A goes from low-to-high, $\overline{A}$ goes from high-to-low. A-low applied to T5 turns-it-off at the same time as T4 is being reversed biased and T3 is first being turned-on. Hence, T5 is turned-off when current is supplied by T3 to T1; T5 thus does not affect or slow down the turn-on of T1. When T3 turns-on, its collector current causes a voltage drop across R3 and when the voltage at its collector drops below $2V_{BE}$, transistors T2A and T2 are turned-off. Hence T1 turns-on quickly and T2 and T2A are turned-off very quickly in response to the low-to-high transition of input signal A. This enables the output capacitance Co to be quickly discharged to the low level.

When the input signal (A) goes from high-to-low the control signal ($\overline{A}$) goes from low-to-high. When A goes below $2V_{BE}$ volts, T4 is forward biased and discharges the base of T3 to the voltage at terminal A, via its main conduction path. When T3 turns-off, current flows from node 22 via R3 into the base of T2A which amplifies the current. This amplified current then flows via the emitter of T2A into R2 and into the base of T2 which further amplifies the current. The collector and base currents of T2 then flow into output terminal 3. In contrast to the Prior Art circuit the output can be charged faster and with less power dissipation since, as discussed below, T1 is turned-off when T2A and T2 are turned-on.

Concurrently with A going from high-to-low, $\overline{A}$ goes from low-to-high. When $\overline{A}$ rises above $V_{BE}$ volts, it turns-on transistor T5 which clamps node 101 via R5 to ground. Once turned-on T5 tends to shunt to ground any current flowing from T3 into node 101 and discharges any charge stored on the base of T1. Since T5 provides a low impedance path between node 101 and ground, it quickly lowers the potential at that node below $V_{BE}$ volts. Since the transition of signals A and $\overline{A}$ respectively applied to the emitter and base of T4 and T5 occur at the same time, T5 tends to react at the time T4 reacts. Furthermore, since a finite time is required for the signal to be transmitted via T4 to the base of T3, T5 tends to turn-on and discharge node 101 to ground as soon as, or just before, T3 is being turned-off. Hence T5 functions to cut-off T1 very effectively. Also, the more T3 turns-off the more effectively T5 functions to quickly turn-off T1 since it then "hogs" all the current flowing into node 101. With T1 turned-off all the current supplied by T2 flows into output terminal 3 and (except for leakage which is neglected) charges output capacitance Co towards $V_{CC}$. Thus any delay in the rise time of the output due to the conduction of T1 is eliminated. Consequently, the speed of response of the low-to-high transition at the output of the circuit is improved.

Figure 3:
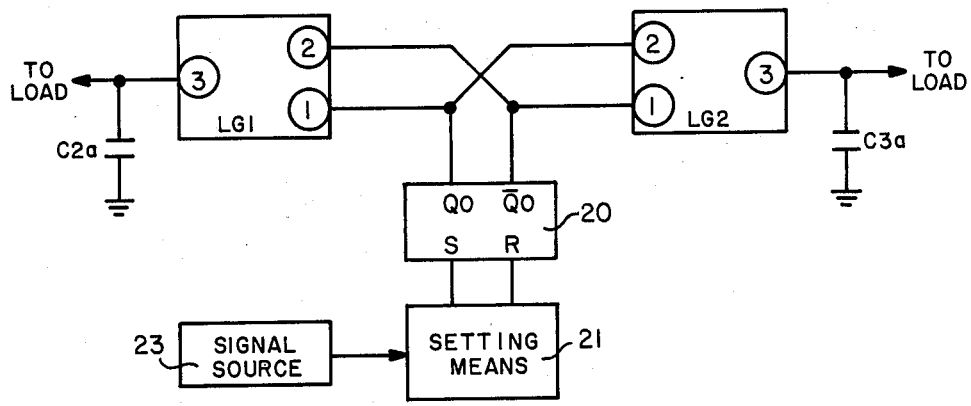
FIG. 3 is a block diagram of circuitry embodying the invention.
Figure 4:
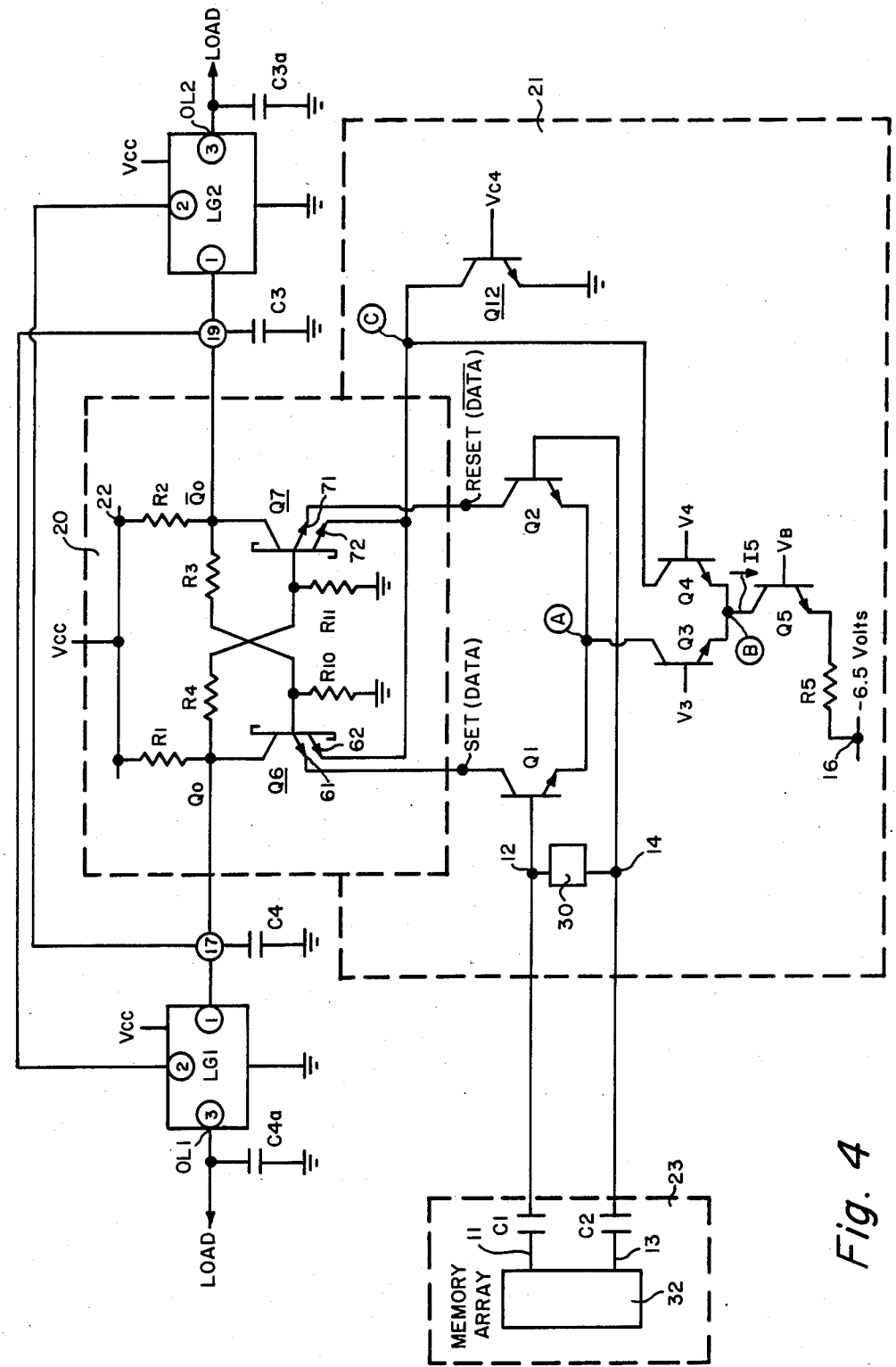
FIG. 4 is a partial schematic, partial block diagram of circuitry embodying the invention.

Advantages of circuits embodying the invention may be best appreciated with reference to the circuits of FIGS. 3 and 4.

FIG. 3 shows a set/reset flip flop 20 driven by a setting means 21 in response to input signals from a signal source 23. Flip-flop 20 has complementary outputs Qo and $\overline{Qo}$. The output Qo is applied to the signal input terminal 1 of a first logic gate, LG1, and to the control input terminal 2 of a second logic gate, LG2; where logic gates LG1 and LG2 are logic gates of the type shown in FIG. 2. The output $\overline{Qo}$ is applied to the signal input terminal 1 of LG2 and to the control input terminal 2 of LG1. The outputs of LG1 and LG2 are connected to, and drive, capacitance C2a and C3a, respectively, as well as additional loads, not shown. When the input signal from source 23 changes state it causes the setting means 21 to either set or reset flip-flop 20. Flip-flop 20 then goes to either one of its two states. That is, it goes from Qo-high and $\overline{Qo}$-low to Qo-low and $\overline{Qo}$-high or from Qo-low and $\overline{Qo}$-high to Qo-high and $\overline{Qo}$-low. Flip-flop 20 then functions as a source of complementary signals applied to the input and control terminals of logic gates LG1 and LG2.

For example, when $\overline{Qo}$ goes high and Qo goes low the output of logic gate LG1 is driven to the high state. With respect to LG1, $\overline{Qo}$-high applied to its control terminal 2 turns-on its T5 which turns-off its T1. Concurrently Qo-low applied to its signal input terminal 1, causes the turn-off of T3, which enables the turn-on of T2A and T2 and the quick rise of the signal at its output terminal 3 toward $V_{CC}$. Meanwhile, $\overline{Qo}$-high applied to terminal 1 of LG2 causes the turn-on of T3 and T1 while Qo-low applied to T5 turns-it-off. Hence the output of LG2 can be driven to ground quickly. Thus the addition of speed up networks in LG1 and LG2 enables the low-to-high transition at the output of LG1 to occur faster and does not slow down the concurrent high-to-low transition at the output of LG2. Furthermore, where a system already includes a flip-flop having complementary outputs, and where the system also requires that the outputs of the flip-flop be buffered or drive logic gates similar to LG1 and LG2, the addition of the active control network 100 ensures that the low-to-high transitions at the outputs occurs faster with very little additional circuitry.

The signal source 23, the setting means 21, and the flip-flop 20 of FIG. 3 may be of the type shown schematically in FIG. 4. A detailed description of the structure and operation of signal setting source 23, setting means 21, and flip-flop 20 are provided in my copending applications bearing Ser. Nos. 556932 and 556931 and respectively titled SENSE CIRCUIT WITH PRE-SETTING MEANS and BIAS NETWORK, assigned to the same assignee as this invention, and the subject matter of which is incorporated herein by reference. A detailed discussion of the structure and operation of FIG. 4 is therefore not deemed necessary. Suffice it to say that signal source 23 which may be a memory array supplies signals to the inputs 12 and 14 of a differential amplifier, comprised of transistors Q1 and Q2, whose input is suitably biased at a predetermined level by a bias means 30. In response to a "high" input to node 12 and a "low" input to node 14, Q1 is turned-on and Q2 is turned-off. Conversely, a "low" applied to node 12 and a "high" applied to node 14 turns-off Q1 and turns-on Q2. The Q1-on and Q2-off condition causes transistor Q6 of flip-flop 20 to conduct and transistor Q7 to turn-off. Conversely, Q1-off and Q2-on causes Q6 to turn-off and Q7 to turn-on. Due to this symmetrical response the condition of Q6 being turned-on and Q7 being turned-off is sufficient to describe the operation of the circuit.

The turn-on of Q6 and the turn-off of Q7 causes Qo to go from high-to-low and $\overline{Qo}$ to go from low-to-high.

However, as detailed in my above cited copending applications, the outputs of flip-flop 20 are unbalanced in that Qo and $\overline{Qo}$ go from high-to-low faster than they can go from low-to-high. This results, in part, from the flip-flop outputs (Qo and $\overline{Qo}$) being clamped to ground via active devices (Q6 or Q7) while they are charged up to $V_{CC}$ via resistors (R1 or R2). The response and operation of logic gates LG1 and LG2 to the unbalanced (skewed) flip-flop output is best explained with reference to the idealized waveforms shown in FIGS. 5A and 5B. For the assumed input signal condition now under discussion, Qo makes its transition from high-to-low faster than $\overline{Qo}$ makes its transition from low-to-high. However, recall that in logic gates LG1 and LG2 the active control transistor T5 turns-on when the signal at its base (control terminal 2) exceeds $V_{BE}$ volts and the input transistor T4 is forward biased (and T3 turned off) when the input signal at terminal 1 goes below 2 $V_{BE}$ volts. Hence, as shown in FIGS. 5A and 5B, the time for $\overline{Qo}$ to rise from the low level to $V_{BE}$ volts (or more) is very nearly equal to the time for Qo to decrease from the high level to 2 $V_{BE}$ volts (or less). The effect the of Qo and $\overline{Qo}$ signals, of the type shown in FIG. 5, on the operation of logic gates LG1 and LG2 is briefly as follows.

At time $t_o$ the signal input (Qo) to terminal 1 of LG1 is high and its control input ($\overline{Qo}$) is low. Hence, at time $t_o$, T3 and T1 are turned-on while T2A, T2 and T5 are off. At time $t_2$, Qo has decreased to 2VBE volts (or less) turning on T4 and turning-off T3 with the resulting turn-on of T2A and T2. Concurrently at time $t_2$, $\overline{Qo}$ reaches $V_{BE}$ volts turning-on T5 which turns off T1. Hence $\overline{Qo}$ going high functions to turn-on T5 and turn-off T1 of LG1 when T2A and T2 of LG1 are being turned-on. Thus, for the skewed output response of the flip flop, which is less than optimal, power dissipation in LG1 is reduced and an increase in the speed of response of the low-to-high transition is obtained.

Let us now examine the response of LG2 to the high-to-low transition of Qo applied to terminal 2 of LG 2 and the low-to-high transition of $\overline{Qo}$ applied to terminal 1 of LG2 as shown in FIG. 5B. At time $t_o$, T3 and T1 of LG2 are off while T5, T2A and T2 of LG2 are on. T5 remains on and T1 remains off until time $t_3$ when Qo decreases to (or below $V_{BE}$ volts, at which time T5 is turned-off. An instant later, at time $t_4$, $\overline{Qo}$ reaches (or exceeds 2 $V_{BE}$ volts, reverse biasing T4 and turning-on T3 and T1 and, concurrently, turning-off T2A and T2. It has just been shown that the turn-on of T1 is not slowed by T5 since the latter is turned-off when T3 is ready to turn-on T1. Thus the speed up circuit 100 improves the low-to-high transition of the circuits (LG2 and LG2) without adversely affecting the high-to-low transition.

What is claimed is:

1. The combination comprising:
   first and second power terminals for the application therebetween of an operating potential;
   first, second, third and fourth transistors of same conductivity type, each transistor having first and second electrodes defining the ends of its main conduction path, and a control electrode whose potential relative to said first electrode determines the conductivity of the transistor;
   an input terminal and a control terminal;
   means for applying external signals to said input and control terminals, said external signals being independent of the signals produced at the first and second electrodes of said first, second, third and fourth transistors;
   an output terminal;
   means coupling the main conduction path of said first transistor between said output terminal and said first power terminal;
   means coupling the main conduction path of said second transistor between said output terminal and said second power terminal;
   means coupling the main conduction path of said third transistor between the control electrodes of said first and second transistors;
   means coupling the main conduction path of said fourth transistor between the control electrode of said first transistor and said first power terminal; and
   means coupling the control electrode of said third transistor to said input terminal and means coupling the control electrode of said input terminal and means coupling the control electrode of said fourth transistor to said control terminal, responsive to the signals at said input and control terminals, for turning-on said fourth transistor and turning off said first transistor when said third transistor is being turned-off.

2. The combination as claimed in claim 1 wherein said means for applying signals to said input and control terminals includes a flip flop having first and second complementary outputs, and wherein one of said flip-flop outputs is connected to said input terminal and the other one of said flip-flop outputs is connected to said control terminal.

3. The combination as claimed in claim 1 wherein each one of said transistors is a bipolar transistor having an emitter and a collector defining the ends of a main conduction path and a base, and wherein each one of said first electrodes is an emitter, each one of said second electrodes is a collector and each one of said control electrodes is a base; and wherein said first transistor is connected to operate in the common emitter mode and said second transistor is connected to operate in the emitter follower mode.

4. The combination as claimed in claim 3 further including means coupled between the control electrode of said second transistor and said second power terminal for biasing said second transistor into conduction when said third transistor is turned-off.

5. The combination as claimed in claim 4 wherein said means coupling the control electrode of said third transistor to said input terminal includes a fifth bipolar transistor having its main conduction path connected between said input terminal and the control electrode of said third transistor.

6. The combination as claimed in claim 5 wherein said means coupling the control electrode of said fourth transistor to said control terminal includes resistive means.

7. The combination as claimed in claim 5 wherein said means coupling the main conduction path of said fourth transistor between the control electrode of said first transistor and said first power terminal includes resistive means for limiting the maximum current therethrough.

8. The combination comprising:

first and second power terminals for the application therebetween of an operating potential;

first, second, third and fourth transistors of same conductivity type, each transistor having first and second electrodes defining the ends of its main conduction path, and a control electrode whose potential relative to said first electrode determines the conductivity of the transistor;

an input terminal and a control terminal;

means for applying external signals to said input and control terminals independent of the signals produced at the first and second electrodes of said first, second, third and fourth transistors;

an output terminal;

means coupling the main conduction path of said first transistor between said output terminal and said first power terminal;

means coupling the main conduction path of said second transistor between said output terminal and said second power terminal;

means coupling the main conduction path of said thrid transistor between the control electrodes of said first and second transistors;

means coupling the main conduction path of said fourth transistor between the control electrode of said frist transistor and said first power termianl; and first means coupling the control electrodes of said third transistor to said input terminal and second means coupling the control electrode of said fourth transistor to said control terminal, said first and second means being responsive to the singals at said input and control terminals, for turning-on said fourth transistor and turning-off said first transistor when said third transistor is being turned-off, and for turning-off said fourth transistor and turning-on said first transistor when said third transistor is being turned-on.

* * * * *

UNITED STATES PATENT AND TRADEMARK OFFICE
CERTIFICATE OF CORRECTION

PATENT NO. : 4,631,422

DATED : Dec. 23, 1986

INVENTOR(S) : Douglas S. Piasecki

It is certified that error appears in the above-identified patent and that said Letters Patent is hereby corrected as shown below:

Col. 3, line 53, change "$\overline{A}$" to --- A ---.

Col. 6, line 4, change "2VEE" to --- $2V_{BE}$ ---.

Col. 6, line 20, after "below" insert --- ) ---.

Col. 6, line 22, after "exceeds" insert --- ) ---.

Col. 6, lines 62-63, after "said" delete --- input terminal and means coupling the control electrode of said ---.

Col. 8, line 23, change "thrid" to --- third ---.

Col. 8, line 27, change "frist" to --- first ---.

Col. 8, line 29, change "electrodes" to --- electrode ---.

Col. 8, line 33, change "singals" to --- signals ---.

Signed and Sealed this

Eighteenth Day of August, 1987

*Attest:*

DONALD J. QUIGG

*Attesting Officer*  *Commissioner of Patents and Trademarks*